US010523367B2

(12) United States Patent
Hof et al.

(10) Patent No.: US 10,523,367 B2
(45) Date of Patent: Dec. 31, 2019

(54) EFFICIENT SURVIVOR MEMORY ARCHITECTURE FOR SUCCESSIVE CANCELLATION LIST DECODING OF CHANNEL POLARIZATION CODES

(71) Applicant: SAMSUNG ELECTRONICS CO., LTD., Suwon-si, Gyeonggi-Do (KR)

(72) Inventors: Eran Hof, Ramat Gan (IL); Moshe Twitto, Ramat Gan (IL); Jun Jin Kong, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 154 days.

(21) Appl. No.: 15/680,661

(22) Filed: Aug. 18, 2017

(65) Prior Publication Data

US 2019/0058547 A1 Feb. 21, 2019

(51) Int. Cl.
*H04L 1/00* (2006.01)
*H03M 13/37* (2006.01)
*H03M 13/45* (2006.01)
*H03M 13/13* (2006.01)

(52) U.S. Cl.
CPC .......... *H04L 1/0058* (2013.01); *H03M 13/13* (2013.01); *H03M 13/3746* (2013.01); *H03M 13/458* (2013.01); *H04L 1/0054* (2013.01); *H04L 1/0057* (2013.01)

(58) Field of Classification Search
CPC ...................................................... H04L 1/0057

USPC ......................................................... 714/776
See application file for complete search history.

(56) References Cited

U.S. PATENT DOCUMENTS

| 9,176,532 | B2 | 11/2015 | Li et al. | |
| 9,176,927 | B2 * | 11/2015 | Gross | G06F 17/10 |
| 9,317,365 | B2 * | 4/2016 | Alhussien | H03M 13/13 |
| 9,503,126 | B2 * | 11/2016 | Vardy | H03M 13/13 |
| 2010/0229076 | A1 | 9/2010 | Shinagawa et al. | |
| 2015/0263767 | A1 | 9/2015 | Shin et al. | |
| 2015/0381208 | A1 | 12/2015 | Li et al. | |

OTHER PUBLICATIONS

Alexios Balatsoukas-Stimming, et al., "LLR-based successive cancellation list decoding of polar codes," IEEE Transaction on Signal Processing, 63(19), 5165-5179, Sep. 2014—revised Mar. 2015.

(Continued)

*Primary Examiner* — Fritz Alphonse
(74) *Attorney, Agent, or Firm* — F. Chau & Associates, LLC

(57) ABSTRACT

A method of storing survivor data generated while decoding channel polarization codes in a memory module includes setting a list size that corresponds to a number of decoder units used to decode the channel polarization codes, inputting a stream of input bits to the decoder units, and sequentially decoding the input bits. Each input bit is decoded using all previous input bits decoded before the each input bit. The method further includes selecting a plurality of survivor bits from among the decoded input bits, and storing the selected survivor bits in the memory module in a binary tree configuration. The number of edges in each level of the binary tree configuration does not exceed the list size.

20 Claims, 8 Drawing Sheets

(56) References Cited

OTHER PUBLICATIONS

Erdal Arikan, "Channel polarization: A method for constructing capacity-achieving codes for symmetric binary-input memoryless channels," Information Theory, IEEE Transactions on, 55(7), 3051-3073, Jul. 7, 2009.

Pascal Giard, et al., "Hardware Decoders for Polar Codes. An Overview." arXiv preprint arXiv:1606.00737 (2016).

* cited by examiner

EFFICIENT SURVIVOR MEMORY ARCHITECTURE FOR SUCCESSIVE CANCELLATION LIST DECODING OF CHANNEL POLARIZATION CODES

TECHNICAL FIELD

The present invention relates to efficient survivor memory architecture for successive cancellation list decoding of channel polarization codes, and more particularly, to a method of storing survivor data generated while decoding channel polarization codes in a memory module, and a channel polarization code decoding system implementing the same.

DISCUSSION OF THE RELATED ART

According to the theory of noisy-channel coding, there are ways in which digital information may be transmitted reliably through a noisy channel, without errors, by using certain coding approaches. Channels may have a particular bandwidth and certain coding techniques have greater overhead than others. The noisier the channel, the greater the overhead of the coding technique needed to ensure reliable transition. Accordingly, noisy channels often have very slow data transmission rates.

One approach for coding that is theoretically able to provide optimal data transmission rates for noisy channels (referred to as "achieving capacity") involves the use of polar codes. In polar coding, ideally ("asymptotically" in mathematical terms), two types of channels are produced, the perfect channel, in which successful reliable transmission of transmitting information is guaranteed, and the useless channel, in which it is theoretically impossible to transmit information. In practice, valid data is transmitted via the perfect channels, and predetermined/fixed information is transmitted via the useless channels. A list successive cancellation decoding technique may be used to perform polar coding.

As flash memory devices increase in capacity and decrease in size, the opportunity for correctly programmed memory cells to spontaneously jump to an incorrect state increases. These spontaneous jumps can corrupt the data that is stored in the flash memory devices.

One approach for increasing reliability in these highly-integrated flash memory devices is to store data therein using error correction codes ("channel coding"). In this case, the storage of data within the flash memory, and the retrieval of data therefrom, is treated like a noisy channel, and by applying channel coding to the data as it is stored, and channel decoding to the data as it is retrieved, the integrity of the data can be preserved.

SUMMARY

According to an exemplary embodiment of the present invention, a method of storing survivor data generated while decoding channel polarization codes in a memory module includes setting a list size. The list size corresponds to a number of decoder units used to decode the channel polarization codes. The method further includes inputting a stream of input bits to the decoder units, and sequentially decoding the input bits. Each input bit is decoded using all previous input bits decoded before the each input bit. The method further includes selecting a plurality of survivor bits from among the decoded input bits, and storing the selected survivor bits in the memory module in a binary tree configuration. The number of edges in each level of the binary tree configuration does not exceed the list size.

In an exemplary embodiment, the input bits are sequentially decoded using a list successive cancellation decoding technique.

In an exemplary embodiment, sequentially decoding the input bits using the list successive cancellation decoding technique includes computing a plurality of intermediate values. The intermediate values are computed by decoding the each input bit based on a plurality of guesses of the values of the previous input bits decoded before the each input bit. Each guess corresponds to a bit value being equal to 0 or being equal to 1.

In an exemplary embodiment, the method further includes selecting a plurality of most probable guesses from among the plurality of guesses using a log-likelihood ratio (LLR) technique, retaining the selected most probable guesses in the memory module, and discarding the guesses from among the plurality of guesses that are not selected as the most probable guesses.

In an exemplary embodiment, storing the selected survivor bits in the memory module in the binary tree configuration includes comparing a first group of intermediate values from among the plurality of intermediate values with a second group of intermediate values from among the plurality of intermediate values. The first and second groups are separated into subgroups, each subgroup corresponding to intermediate values obtained during one of a plurality of stages of the sequential decoding process. The comparison is made on a stage-by-stage basis. Each stage corresponds to one of the levels of the binary tree configuration. Storing the selected survivor bits further includes generating the edges in each of the levels of the binary tree configuration based on the comparison result.

In an exemplary embodiment, generating the edges in each of the levels of the binary tree configuration based on the comparison result includes comparing intermediate values from a subgroup of the first group with corresponding intermediate values from a subgroup of the second group, generating only a left edge at a vertex when the compared intermediate values include an intermediate value in the subgroup of the first group that is equal to 1 and an intermediate value in the subgroup of the second group that is equal to 0, generating only a right edge at the vertex when the compared intermediate values include an intermediate value in the subgroup of the first group that is equal to 0 and an intermediate value in the subgroup of the second group that is equal to 1, generating both the left edge and the right edge at the vertex when the compared intermediate values include an intermediate value in the subgroup of the first group that is equal to 1 and an intermediate value in the subgroup of the second group that is equal to 1, and generating neither the left edge nor the right edge at the vertex when the compared intermediate values include an intermediate value in the subgroup of the first group that is equal to 0 and an intermediate value in the subgroup of the second group that is equal to 0. The vertex corresponds to the compared intermediate values.

In an exemplary embodiment, the left edges represent a value of 0 and the right edges represent a value of 1.

In an exemplary embodiment, the left edges represent a value of 1 and the right edges represent a value of 0.

In an exemplary embodiment, generating the edges in each of the levels of the binary tree configuration based on the comparison result includes comparing intermediate values from a subgroup of the first group with corresponding intermediate values from a subgroup of the second group, generating only a left edge at a vertex when the compared intermediate values include an intermediate value in the subgroup of the first group that is equal to 0 and an intermediate value in the subgroup of the second group that is equal to 1, generating only a right edge at the vertex when the compared intermediate values include an intermediate value in the subgroup of the first group that is equal to 1 and an intermediate value in the subgroup of the second group that is equal to 0, generating both the left edge and the right edge at the vertex when the compared intermediate values include an intermediate value in the subgroup of the first group that is equal to 1 and an intermediate value in the subgroup of the second group that is equal to 1, and generating neither the left edge nor the right edge at the vertex when the compared intermediate values include an intermediate value in the subgroup of the first group that is equal to 0 and an intermediate value in the subgroup of the second group that is equal to 0. The vertex corresponds to the compared intermediate values.

In an exemplary embodiment, generating the edges in each of the levels of the binary tree configuration based on the comparison result includes comparing intermediate values from a subgroup of the first group with corresponding intermediate values from a subgroup of the second group, generating only a left edge at a vertex when the compared intermediate values include an intermediate value in the subgroup of the first group that is equal to 1 and an intermediate value in the subgroup of the second group that is equal to 0, generating only a right edge at the vertex when the compared intermediate values include an intermediate value in the subgroup of the first group that is equal to 0 and an intermediate value in the subgroup of the second group that is equal to 1, generating both the left edge and the right edge at the vertex when the compared intermediate values include an intermediate value in the subgroup of the first group that is equal to 0 and an intermediate value in the subgroup of the second group that is equal to 0, and generating neither the left edge nor the right edge at the vertex when the compared intermediate values include an intermediate value in the subgroup of the first group that is equal to 1 and an intermediate value in the subgroup of the second group that is equal to 1. The vertex corresponds to the compared intermediate values.

In an exemplary embodiment, generating the edges in each of the levels of the binary tree configuration based on the comparison result includes comparing intermediate values from a subgroup of the first group with corresponding intermediate values from a subgroup of the second group, generating only a left edge at a vertex when the compared intermediate values include an intermediate value in the subgroup of the first group that is equal to 0 and an intermediate value in the subgroup of the second group that is equal to 1, generating only a right edge at the vertex when the compared intermediate values include an intermediate value in the subgroup of the first group that is equal to 1 and an intermediate value in the subgroup of the second group that is equal to 0, generating both the left edge and the right edge at the vertex when the compared intermediate values include an intermediate value in the subgroup of the first group that is equal to 0 and an intermediate value in the subgroup of the second group that is equal to 0, and generating neither the left edge nor the right edge at the vertex when the compared intermediate values include an intermediate value in the subgroup of the first group that is equal to 1 and an intermediate value in the subgroup of the second group that is equal to 1. The vertex corresponds to the compared intermediate values.

In an exemplary embodiment, the memory module is a flash memory.

According to an exemplary embodiment of the present invention, a channel polarization code decoding system includes a memory module, and a plurality of decoder units that receive and sequentially decode a stream of input bits. The input bits represent channel polarization codes. Each input bit is decoded using all previous input bits decoded before the each input bit. The channel polarization code decoding system further includes a processor that sets a list size and selects a plurality of survivor bits from among the decoded input bits. The list size corresponds to a total number of the decoder units. The channel polarization code decoding system further includes a memory controller that controls the memory module to store the selected survivor bits in the memory module in a binary tree configuration under control of the processor. The number of edges in each level of the binary tree configuration does not exceed the list size.

In an exemplary embodiment, each decoder unit is a list successive cancellation decoder unit that decodes the input bits using a list successive cancellation decoding technique.

In an exemplary embodiment, the decoder units decode the input bits using the list successive cancellation decoding technique by computing a plurality of intermediate values. The intermediate values are computed by decoding the each input bit based on a plurality of guesses of the values of the previous input bits decoded before the each input bit. Each guess corresponds to a bit value being equal to 0 or being equal to 1.

In an exemplary embodiment, the memory controller controlling the memory module to store the selected survivor bits in the memory module in the binary tree configuration under control of the processor includes comparing a first group of intermediate values from among the plurality of intermediate values with a second group of intermediate values from among the plurality of intermediate values. The first and second groups are separated into subgroups, each subgroup corresponding to intermediate values obtained during one of a plurality of stages of the sequential decoding process. The comparison is made on a stage-by-stage basis. Each stage corresponds to one of the levels of the binary tree configuration. The memory controller controlling the memory module further includes generating the edges in each of the levels of the binary tree configuration based on the comparison result.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
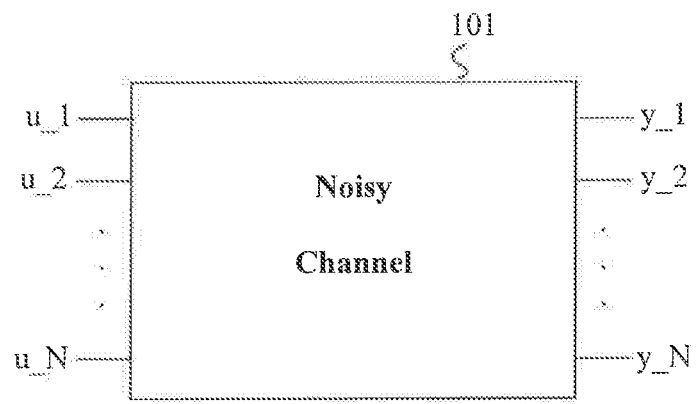
FIG. 1 illustrates an example of a noisy channel into which inputs bits are input and noisy observations are output, according to an exemplary embodiment of the present invention.

Exemplary embodiments of the present invention will be described more fully hereinafter with reference to the accompanying drawings. Like reference numerals may refer to like elements throughout the accompanying drawings.

Exemplary embodiment of the present invention relate to efficiently storing survivor data (e.g., survivor bits) generated while decoding channel polarization codes in a memory module.

According to exemplary embodiments of the present invention, a memory module (also referred to as a memory device) refers to a non-volatile memory. For example, the non-volatile memory may be flash memory or configured with flash memory chips, but the present invention is not limited thereto. Flash memory represents non-volatile memory for storing data. According to exemplary embodiments of the present invention, the flash memory may include, for example, NAND or VNAND flash memory. The flash memory may be single-level cell (SLC), multi-level cell (MLC), or triple-level (TLC) flash memory, etc. The flash memory is not limited to any particular capacity or configuration. For example, the number of physical blocks, the number of physical pages per physical block, the number of sectors per physical page, and the size of the sectors may vary. It is to be understood that when survivor data is described herein as being stored in a memory module, the survivor data is being stored in a memory module as described above, and not in a computer register(s).

The term "unit", as used herein, means, but is not limited to, a software or hardware component, such as a field programmable gate array (FPGA) or an application specific integrated circuit (ASIC), which performs certain tasks. A unit or module may be configured to reside in an addressable storage medium and configured to execute on one or more processors. The terms "unit" and "module" may be used interchangeably herein. As used herein, the term "list decoder unit" may be understood to refer to a single decoder unit, or to a collective a group of decoder units that together decode channel polarization codes. The terms "decoder," "decoder unit," and "decoder circuit" may be used interchangeably herein to described a decoder used to decode polar codes.

Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules, or further separated into additional components and units or modules.

In polar coding, information is transmitted along perfect channels, and useless channels are predetermined to carry fixed values that are known to the device decoding the information stored in a memory module, or by the device decoding the received transmission. The fixed values of the useless channels are known at the decoding end, as decoding polar codes may fail if the value of channels is not known. Accordingly, these useless channels may be configured to send only a predetermined value such as, for example, zero. It is understood that in decoding, it can be established, by the decoder unit, which channels are the useless channels, and so the decoder unit can know to assign the decoded information for these channels as the predetermined value, for example, zero.

During channel polarization, information in a vector $u\_1, u\_2, \ldots u\_N$ (e.g., input bits) is input to a noisy channel (e.g., a memory module, a communication channel, etc.) and is decoded based on noisy observations $y\_1, y\_2, \ldots y\_N$ (e.g., noisy versions of the input bits output through the channel). Herein, N denotes the total number of bits being decoded. At each stage of the decoding, a new bit is decoded based on the knowledge of the already decoded bits. For example, the bit $u\_i$ is decoded based on the bits $u\_1, u\_2, \ldots u\_(i-1)$ and the entirety of the noisy observations $y\_1, y\_2, \ldots y\_N$ (e.g., all of the noisy versions of the bits). FIG. 1 shows an example of such a noisy channel 101 into which inputs bits are input and noisy observations are output. List successive cancellation decoding may be performed during channel polarization.

When list successive cancellation decoding is performed, at each stage of the decoding process, a list of L survivor candidates is maintained. For example, during list successive cancellation decoding, at each stage, the previous decoded values are used to decode the current value. In some situations, a value is not known. In such a situation, a first decoding operation may be performed based on the assumption that the unknown value is 0, and a second decoding operation may be performed based on the assumption that the unknown value is 1. Thus, it may be said that the unknown value is guessed (e.g., guessed to be 0 or guessed to be 1), and decoding proceeds based on both of these guesses. At the end of the decoding process, it may be determined which guess is correct.

However, retaining all of the guesses (e.g., storing all of the guesses in memory) requires a very large amount of resources (e.g., memory and processing requirements). Thus, a certain number of guesses may be retained in memory and a certain number of guesses may be discarded. The number of guesses retained corresponds to the list size, which corresponds to the number of decoder units used during decoding. For example, for a list of size 10, the 10 most probable guesses are retained. However, since there are 10 decoder units, and since each decoder unit guesses two values (e.g., 0 and 1), 20 guesses are made during decoding, and 10 of these 20 guesses are not retained, as described above. The 10 most probable guesses that are retained are referred to as survivors (also referred to as survivor bits). List decoding continues using the survivor bits. At each stage, a decision is made as to which guess is the survivor that is going to be retained. Each guess made during list successive cancellation decoding results in different intermediate values. Since processing is performed for both scenarios in which the value is guessed to be 0 and the value is guessed to be 1, a large number of sets of different intermediate values results.

Log-likelihood ratio (LLR) may be used to determine the most probable guess. For example, LLR may be utilized to determine the probability whether, based on the previously decoded bits and the noisy observations, a value being guessed is more likely to be 0 or 1. When LLR is utilized, the intermediate values may be referred to as intermediate LLR values (since LLR is utilized to arrive at the intermediate values). For example, using LLR, the probability that an unknown value is 0 is computed, the probability that the unknown value is 1 is computed, and the value that has the higher probability is selected as the most probable guess.

At each stage of list successive cancellation decoding, a list of L survivor candidates is maintained. U_i denotes the set of L survivor candidates that are decoded after decoding at stage i is concluded:

$$U\_i = \{(u\_1(l), u\_2(l), \ldots u\_i(l)) \in \{0,1\}^i : 1 \in [L]\}$$

As described above, at each stage of decoding, a decision is made as to which guess is the survivor that is going to be retained. Each survivor (u_1, . . . u_i) in U_i is then duplicated and extended with a single new bit to (u_1, . . . , u_i,0) and (u_11, . . . , u_i,1). U_i* denotes the new 2L survivors. The 2L probabilities (or similar proportional functions) are evaluated based on the following:

$$Pr(y\_1, \ldots, y\_N | (u\_1(l), u\_2(l), \ldots u\_i(l), 0)), l \in [L]$$

and $$Pr(y\_1, \ldots, y\_N | (u\_(l), u\_2(l), \ldots u\_i(l), 1)), l \in [L]$$

The new list of L survivors U_{i+1} is set to the L vectors in U_i^* that achieves the highest L probabilities out of the 2L probabilities. For example, at each stage, the guess (e.g., 0 or 1) having the higher probability of being correct is selected based on the noisy observations y_1, y_2, . . . y_N. Utilizing successive list decoding in this manner results in improved performance in polar channel coding.

In comparative examples, the decoding of polar codes retains all U values (e.g., retains all survivors), certain XOR values of subsets of previously decoded U values (referred to herein as partial sums), and certain additional pointers to temporary LLR values being evaluated in registers in which each register input is provided with a controllable multiplexer (MUX) module. In this context, the terms "U values" and "survivors" may be used interchangeably. The inputs of the MUX come from all corresponding registers of the other survivors in the list. List decoding of polar codes is typically implemented in this manner. This implementation allows for the copying of the content of every survivor memory unit to another survivor memory unit in a single clock, and allows for accurate survivor management during list decoding of polar codes. However, this implementation has a high cost in regards to both power consumption and the physical space required for hardware components.

Exemplary embodiments of the present invention provide an improved and efficient approach to survivor management during a list successive cancellation decoding technique used while decoding channel polarization codes. The improved approach to survivor management includes an efficient manner of storing survivor data (e.g., survivor bits) in a memory module that requires less resources relative to comparative examples. For example, unlike other techniques in comparative examples, the decoding technique provided by exemplary embodiments may be implemented without the use of registers and multiplexers (and consequently, without the need for buses used to route the inputs and outputs of the multiplexers). Since the decoding technique provided by exemplary embodiments is implemented in a memory module and does not require data being stored and managed by computer registers and multiplexers, less space is occupied in the decoding circuitry.

For example, exemplary embodiments provide an improved scheme of maintaining a memory of the currently processed and retained L survivors at each of the decoding steps/stages, which will be described in detail below. For example, regarding U values (e.g., survivors), according to exemplary embodiments, U values may be managed without utilizing registers and MUX units (and thus, also without the additional routings between the registers and MUX units), as described above. Exemplary embodiments provide the ability to store the U values in regular memory blocks without the need for costly copy operations. Regarding partial sums, exemplary embodiments provide a storage architecture that utilizes pointer-based memory, in which only the pointers are copied. In addition, according to exemplary embodiments, the same pointers used for intermediate LLR values may also be used for partial sum values. In such embodiments, a regular memory block module is used for the partial sums, and the additional registers and additional copy operations typically specifically needed for partial sums are not needed, since copy operations relating to the partial sums are combined with the pointer copy procedure already being used for intermediate LLR values.

In comparative examples, although the use of pointers implemented in registers that switch values may be used during some phases of list decoding of polar codes, they are typically only used for the intermediate LLR values. That is, typically, during list decoding of polar codes, pointers implemented in registers may be used for the intermediate LLR values, but are not used to manage U values and partial sum values; rather, a large register block including non-efficient switching circuits is typically used to manage U values and partial sum values. In contrast, according to exemplary embodiments of the present invention, regarding the U values, an efficient dynamic sorting process of "left and right" survivors is implementable in a memory block without utilizing registers and/or pointers, as described in further detail below with reference to FIGS. 2 to 4. Regarding the partial sum values, exemplary embodiments of the present invention provide a constructive implementation of pointer-based survivor memory that utilizes the same pointers already used for intermediate LLR values, improving efficiency. For example, as described in detail below, exemplary embodiments utilize the same machinery (e.g., the same decoder units and memory modules) that is used for LLR intermediate values for partial sum values without duplicating any of the machinery (e.g., without requiring dedicated machinery for the LLR intermediate values).

According to exemplary embodiments of the present invention, an extra bit is stored per each survivor bit. Thus, compared to the comparative examples described herein, the amount of memory required to store L length-N survivor is doubled. The scheme described herein according to exemplary embodiments is implementable in a memory module rather than in registers. In addition, the scheme described herein does not require the complicated MUX input switching logic and routing required per each register bit as used in comparative examples.

Herein, the memory values are denoted according to a_i(l) and b_i(l), where i/in[N] is the row index and l/in[L] is the column index. L refers to the list size, and N refers to the total bits input to the memory. In total, N*2L survivor bits are retained (instead of NL survivor bits). The memory values are set line by line during the decoding procedure. At the i-th processing stage, a_i(l) is set to 1 if and only if the l-th survivor extended by zero is kept within the L survivors. Similarly, the bit b_i(l) is set to 1 if and only if the l-th survivor is kept with an additional one bit extension. The bits are set to 0 when a survivor extension is not kept within the L survivor paths to the next decoding stage (the i+1th stage).

Figure 2:
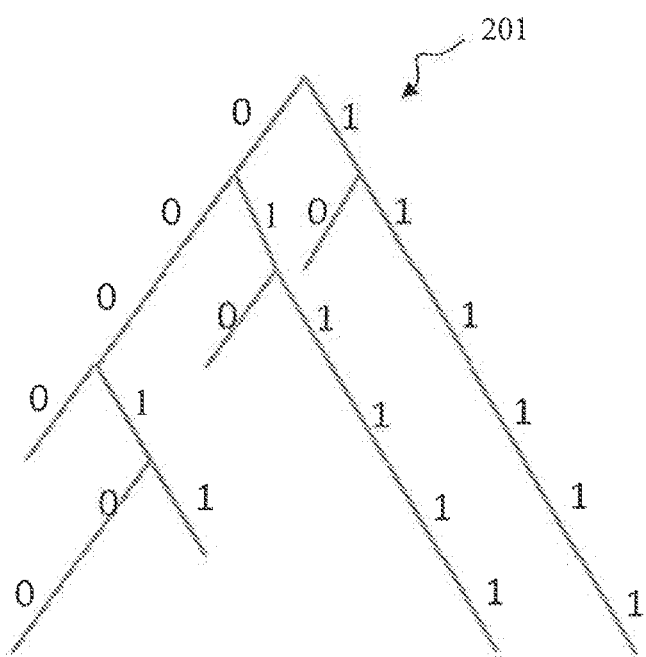
FIG. 2 illustrates a partial binary tree illustrating the survivor of a list decoder unit with a list size of 4, according to an exemplary embodiment of the present invention.

FIG. 2 shows a partial binary tree illustrating the survivor of a list decoder unit with a list size of 4 according to exemplary embodiments of the present invention.

Figure 3:
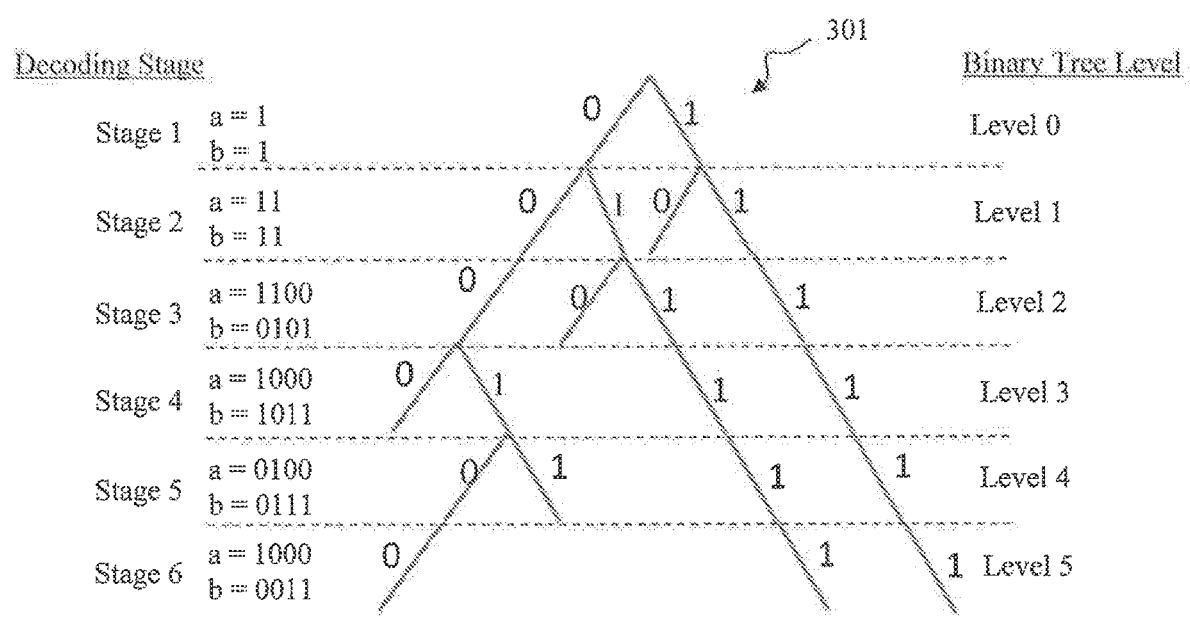
FIG. 3 illustrates the partial binary tree of FIG. 2 with corresponding values of a_i(l) and b_i(l) corresponding to each level of the binary tree overlaid on the binary tree, according to an exemplary embodiment of the present invention.

FIG. 3 shows the partial binary tree of FIG. 2 with corresponding values of a_i(l) and b_i(l) corresponding to each level of the binary tree overlaid on the binary tree.

Referring to FIGS. 2 and 3, at each step, the binary tree 201/301 is enlarged. However, only 4 edges are retained since the list size is 4. That is, at each step, a maximum of 4 edges are retained, as shown in FIGS. 2 and 3. The corresponding a_i(l) and b_i(l) are shown below, where each semicolon indicates a new row of data:

$$a=[1;11;1100;1000;0100;1000]$$

and $$b=[1;11;0101;1011;0111;0011]$$

Survivors may be re-generated by reading the memory content forward or backward. For example, traversing the tree shown in FIGS. 2 and 3 from the bottom up, the last rows are a=1000 and b=0011. As a result, 4 vertices are drawn: a first (e.g., the leftmost) vertex having a 0 edge and not having a 1 edge since the first a bit is 1 and the first b bit is 0, a second vertex having no edges since the second a bit and the second b bit are both 0, a third vertex not having a 0 edge and having a 1 edge since the third a bit is 0 and the third b bit is 1, and a fourth (e.g., the rightmost) vertex not having a 0 edge and having a 1 edge since the fourth a bit is 0 and the fourth b bit is 1.

The next rows, moving from the bottom to the top of the tree, are a=0100 and b=0111. As a result, 4 vertices are drawn: a first (e.g., the leftmost) vertex having no edges since both the first a bit and the first b bit are 0, a second vertex having both a 0 edge and a 1 edge since both the second a bit and the second b bit are 1, a third vertex not having a 0 edge and having a 1 edge since the third a bit is 0 and the third b bit is 1, and a fourth (e.g., the rightmost) vertex not having a 0 edge and having a 1 edge since the fourth a bit is 0 and the fourth b bit is 1.

The next rows, moving from the bottom to the top of the tree, are a=1000 and b=1011. As a result, 4 vertices are drawn: a first (e.g., the leftmost) vertex having a 0 edge and a having 1 edge since both the first a bit and the first b bit is 1, a second vertex having no edges since both the second a bit and the second b bit is 0, a third vertex not having a 0 edge and having a 1 edge since the third a bit is 0 and the third b bit is 1, and a fourth (e.g., the rightmost) vertex not having a 0 edge and having a 1 edge since the fourth a bit is 0 and the fourth b bit is 1.

The next rows, moving from the bottom to the top of the tree, are a=1100 and b=0101. As a result, 4 vertices are drawn: a first (e.g., the leftmost) vertex having a 0 edge and not having a 1 edge since the first a bit is 1 and the first b bit is 0, a second vertex having a 0 edge and having a 1 edge since both the second a bit and the second b bit is 1, a third vertex having no edges since both the third a bit and the third b bit is 0, and a fourth (e.g., the rightmost) vertex not having a 0 edge and having a 1 edge since the fourth a bit is 0 and the fourth b bit is 1.

The next rows, moving from the bottom to the top of the tree, are a=11 and b=11. As a result, two vertices are drawn: a first vertex having a 0 edge and a 1 edge since both the first a bit and the first b bit is 1, and a second vertex having a 0 edge and a 1 edge since both the second a bit and the second b bit is 1.

The next rows (e.g., the uppermost rows), moving from the bottom to the top of the tree, are a=1 and b=1. As a result, a vertex is drawn having a 0 edge and having a 1 edge since both the a bit and the b bit are 1.

To determine which survivor belongs to which decoder unit, each decoder unit may maintain a single pointer of size log_2 L bits, where L is the list size. Once it has been determined which decoder unit is the most efficient decoder unit, it is determined from which survived edge of the last row copying of the required survivor should be begin. In exemplary embodiments, in a case in which a decision is based on data within the survivor, the pointer is not maintained. Such a case may be a situation in which choosing a survivor is implemented via an error detection code. However, if error detection is performed during the decoding procedure, for example, as is common in a cyclic redundancy check (CRC) implementation in which bits are provided for the CRC detector bit by bit during their evaluation, the intermediate inner states of the error detection code are retained and copied. Since this typically amounts to a small number of bits with respect to the overall survivor length, efficiency is maintained.

Figure 4:
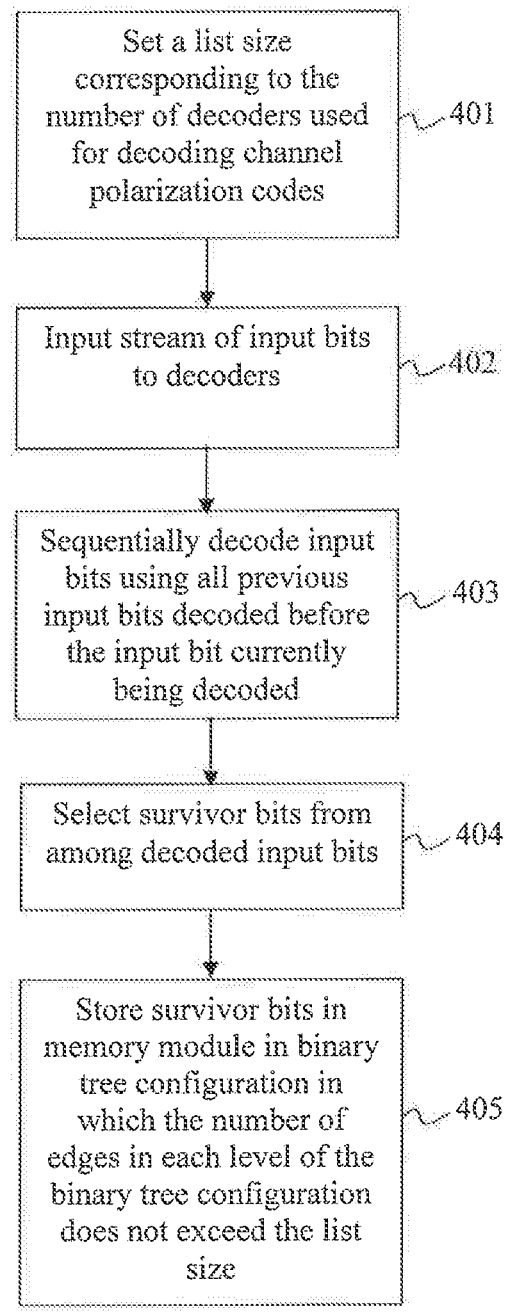
FIG. 4 is a flowchart illustrating a method of storing survivor data generated while decoding channel polarization codes in a memory module, according to an exemplary embodiment of the present invention.

FIG. 4 is a flowchart illustrating a method of storing survivor data generated while decoding channel polarization codes in a memory module, according to an exemplary embodiment of the present invention.

At block 401, a list size is set. As described above, the list size corresponds to the number of decoders that are used in the channel polarization codes decoding process. For example, if decoding channel polarization codes is performed using 4 decoders, the list size is set to 4. At block 402, a stream of input bits (e.g., input bits u_1, u_2, ... u_N as described above) is input to the decoders that are being used to decode the channel polarization codes. At block 403, the input bits are sequentially decoded. As described above, the input bits may be sequentially decoded using a list successive cancellation decoding technique. Each input bit is decoded using all previous input bits decoded before the each input bit. For example, if the input bits are u_1, u_2, u_3, ... u_N, the value of input bit u_1 is computed, the value of input bit u_2 is then computed using the computed value of input bit u_1, the value of input bit u_3 is then computed using the computed values of input bits u_1 and u_2, etc.

At block 404, a plurality of survivor bits is selected from among the decoded input bits computed at block 403. At block 405, the selected survivor bits are stored in the memory module. The selected survivor bits are stored in a binary tree configuration in which the number of edges in each level of the binary tree configuration does not exceed the list size, as described above with reference to FIGS. 2 and 3. Thus, if the list size is set 4, the number of edges in each level of the binary tree configuration does not exceed 4.

When the input bits are sequentially decoded using the list successive cancellation decoding technique, a plurality of intermediate values are computed. The intermediate values are the values computed by the decoder units at the various stages of the decoding process. The intermediate values are computed by decoding each input bit based on a plurality of guesses of the values of the previous input bits decoded before the input bit currently being decoded, as described above. Further, as described above, each guess corresponds to a bit value being equal to 0 or being equal to 1.

According to exemplary embodiments, the method of storing survivor data generated while decoding channel polarization codes in the memory module includes selecting a plurality of most probable guesses from among the plurality of guesses using a log-likelihood ratio (LLR) technique, retaining the selected most probable guesses in the memory module, and discarding the other guesses that have not been selected as the most probable guesses.

Referring again to FIGS. 2 and 3, according to exemplary embodiments, data set a corresponds to a first group of intermediate values from among the plurality of intermediate values generated while decoding the channel polarization codes, and data set b corresponds to a second group of intermediate values from among the plurality of intermediate values generated while decoding the channel polarization codes. The process of storing the survivor bits in the memory module in the binary tree configuration 201/301 may be performed in the following manner.

As shown in FIG. 3, the first group of intermediate values (data set a) and the second group of intermediate values (data set b) are each separated into a plurality of subgroups of bits. Each subgroup corresponds to intermediate values obtained during one of the stages of the sequential decoding process (e.g., decoding of input bit u_1 occurs in a first stage, decoding of input bit u_2 occurs in a second stage, decoding of input bit u_3 occurs in a third stage, etc.).

For example, in the exemplary decoding scenario described with reference to FIG. 3, data set a=[1; 11; 1100; 1000; 0100; 1000] and data set b=[1; 11; 0101; 1011; 0111; 0011]. In the first group of intermediate values (data set a), the first subgroup of bits includes bit 1, the second subgroup of bits includes bits 11, the third subgroup of bits includes bits 1100, the fourth subgroup of bits includes bits 1000, the fifth subgroup of bits includes bits 0100, and the sixth subgroup of bits includes bits 1000. In the second group of intermediate values (data set b), the first subgroup of bits includes bit 1, the second subgroup of bits includes bits 11, the third subgroup of bits includes bits 0101, the fourth subgroup of bits includes bits 1011, the fifth subgroup of bits includes bits 0111, and the sixth subgroup of bits includes bits 0011.

Each decoding stage corresponds to a level of the binary tree configuration 301. For example, referring still to FIG. 3, the first stage of the decoding process, in which a=1 and b=1, corresponds to level 0 of the binary tree configuration 301. The second stage of the decoding process, in which a=11 and b=11, corresponds to level 1 of the binary tree configuration 301. The third stage of the decoding process, in which a=1100 and b=0101, corresponds to level 2 of the binary tree configuration 301. The fourth stage of the decoding process, in which a=1000 and b=1011, corresponds to level 3 of the binary tree configuration 301. The fifth stage of the decoding process, in which a=0100 and b=0111, corresponds to level 4 of the binary tree configuration 301. The sixth stage of the decoding process, in which a=1000 and b=0011, corresponds to level 5 of the binary tree configuration 301.

The comparison of intermediate values is made on a stage-by-stage basis. For example, referring still to FIG. 3, in stage 1, the first bit of data set a (bit value=1) is compared to the first bit of data set b (bit value=1). In stage 2, the first bit of data set a (bit value=1) is compared to the first bit of data set b (bit value=1), and the second bit of data set a (bit value=1) is compared to the second bit of data set b (bit value=1). In stage 3, the first bit of data set a (bit value=1) is compared to the first bit of data set b (bit value=0), the second bit of data set a (bit value=1) is compared to the second bit of data set b (bit value=1), the third bit of data set a (bit value=0) is compared to the third bit of data set b (bit value=0), and the fourth bit of data set a (bit value=0) is compared to the fourth bit of data set b (bit value=1). In stage 4, the first bit of data set a (bit value=1) is compared to the first bit of data set b (bit value=1), the second bit of data set a (bit value=0) is compared to the second bit of data set b (bit value=0), the third bit of data set a (bit value=0) is compared to the third bit of data set b (bit value=1), and the fourth bit of data set a (bit value=0) is compared to the fourth bit of data set b (bit value=1). In stage 5, the first bit of data set a (bit value=0) is compared to the first bit of data set b (bit value=0), the second bit of data set a (bit value=1) is compared to the second bit of data set b (bit value=1), the third bit of data set a (bit value=0) is compared to the third bit of data set b (bit value=1), and the fourth bit of data set a (bit value=0) is compared to the fourth bit of data set b (bit value=1). In stage 6, the first bit of data set a (bit value=1) is compared to the first bit of data set b (bit value=0), the second bit of data set a (bit value=0) is compared to the second bit of data set b (bit value=0), the third bit of data set a (bit value=0) is compared to the third bit of data set b (bit value=1), and the fourth bit of data set a (bit value=0) is compared to the fourth bit of data set b (bit value=1).

The edges of the binary tree configuration 301 are generated based on the comparison result of the subgroups of bits belonging to the first group of intermediate values (data set a) and the second group of intermediate values (data set b).

For example, the vertices in the binary tree configuration 301 correspond to the bits belonging to the first group of intermediate values (data set a) and the second group of intermediate values (data set b). In FIG. 3, at each level, the vertices disposed in a direction from left to right respectively correspond to bits 1 through 4 in data sets a and b. Thus, level 0 includes only 1 vertex since data sets a and b each include only 1 bit, and level 1 includes only two vertices since data sets a and b each include only 2 bits. Edges generated at each vertex in each level are generated based on the comparison result of the bits of the subgroups corresponding to that level, as described above.

In an exemplary embodiment, only a left edge is generated at a vertex when the compared intermediate values include an intermediate value in the subgroup of the first group (data set a) that is equal to 1 and an intermediate value in the subgroup of the second group (data set b) that is equal to 0. Alternatively, only a right edge is generated at a vertex when the compared intermediate values include an intermediate value in the subgroup of the first group (data set a) that is equal to 0 and an intermediate value in the subgroup of the second group (data set b) that is equal to 1. Alternatively, both a left edge and a right edge are generated at a vertex when the compared intermediate values include an intermediate value in the subgroup of the first group (data set a) that is equal to 1 and an intermediate value in the subgroup of the second group (data set b) that is equal to 1. Alternatively, neither a left edge nor a right edge is generated at a vertex when the compared intermediate values include an intermediate value in the subgroup of the first group (data set a) that is equal to 0 and an intermediate value in the subgroup of the second group (data set b) that is equal to 0.

In the exemplary embodiment shown in FIG. 3, the left edges represent a bit value of 0 and the right edges represent a bit value of 1. However, exemplary embodiments are not limited thereto. For example, in exemplary embodiments, the left edge may represent a bit value of 1 and the right edge may represent a bit value of 0.

Generation of the edges in the binary tree representation 301 are not limited to the scheme disclosed in FIG. 3.

For example, in an exemplary embodiment, only a left edge is generated at a vertex when the compared intermediate values include an intermediate value in the subgroup of the first group (data set a) that is equal to 0 and an intermediate value in the subgroup of the second group (data set b) that is equal to 1. Alternatively, only a right edge is generated at a vertex when the compared intermediate values include an intermediate value in the subgroup of the first group (data set a) that is equal to 1 and an intermediate value in the subgroup of the second group (data set b) that is equal to 0. Alternatively, both a left edge and a right edge is generated at a vertex when the compared intermediate values include an intermediate value in the subgroup of the first group (data set a) that is equal to 1 and an intermediate value in the subgroup of the second group (data set b) that is equal to 1. Alternatively, neither a left edge nor a right edge is generated at a vertex when the compared intermediate values include an intermediate value in the subgroup of the first group (data set a) that is equal to 0 and an intermediate value in the subgroup of the second group (data set b) that is equal to 0.

In an exemplary embodiment, only a left edge is generated at a vertex when the compared intermediate values include an intermediate value in the subgroup of the first group (data set a) that is equal to 1 and an intermediate value in the subgroup of the second group (data set b) that is equal to 0. Alternatively, only a right edge is generated at a vertex when the compared intermediate values include an intermediate value in the subgroup of the first group (data set a) that is equal to 0 and an intermediate value in the subgroup of the second group (data set b) that is equal to 1. Alternatively, both a left edge and a right edge is generated at a vertex when the compared intermediate values include an intermediate value in the subgroup of the first group (data set a) that is equal to 0 and an intermediate value in the subgroup of the second group (data set b) that is equal to 0. Alternatively, neither a left edge nor a right edge at a vertex when the compared intermediate values include an intermediate value in the subgroup of the first group (data set a) that is equal to 1 and an intermediate value in the subgroup of the second group (data set b) that is equal to 1.

In an exemplary embodiment, only a left edge is generated at a vertex when the compared intermediate values include an intermediate value in the subgroup of the first group (data set a) that is equal to 0 and an intermediate value in the subgroup of the second group (data set b) that is equal to 1. Alternatively, only a right edge is generated at a vertex when the compared intermediate values include an intermediate value in the subgroup of the first group (data set a) that is equal to 1 and an intermediate value in the subgroup of the second group (data set b) that is equal to 0. Alternatively, both a left edge and a right edge are generated at a vertex when the compared intermediate values include an intermediate value in the subgroup of the first group (data set a) that is equal to 0 and an intermediate value in the subgroup of the second group (data set b) that is equal to 0. Alternatively, neither a left edge nor a right edge is generated at a vertex when the compared intermediate values include an intermediate value in the subgroup of the first group (data set a) that is equal to 1 and an intermediate value in the subgroup of the second group (data set b) that is equal to 1.

Figure 5A:
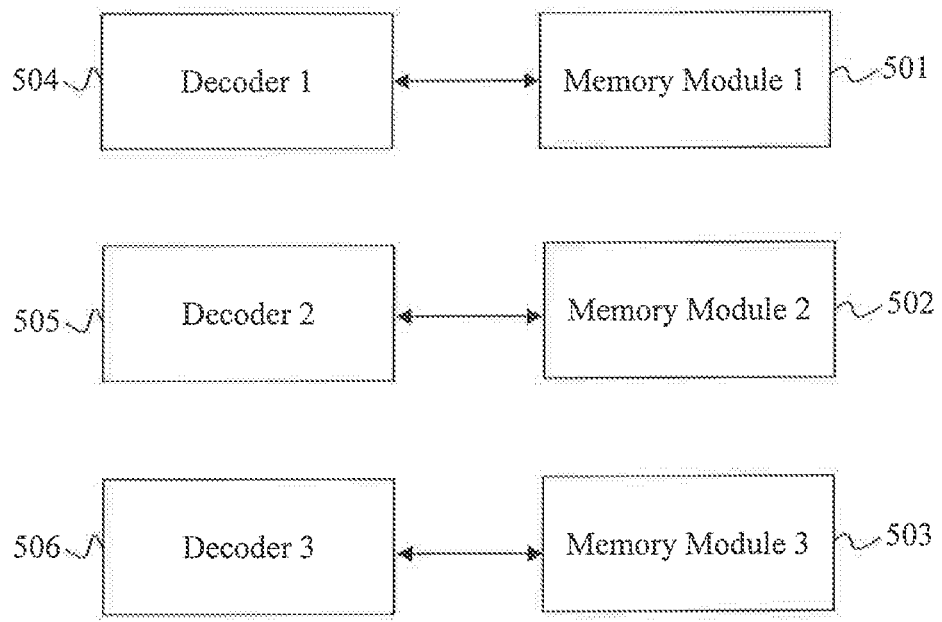
FIGS. 5A and 5B illustrate decoder units and memory modules prior to and after a survivor copy operation, according to an exemplary embodiment of the present invention.
Figure 5B:
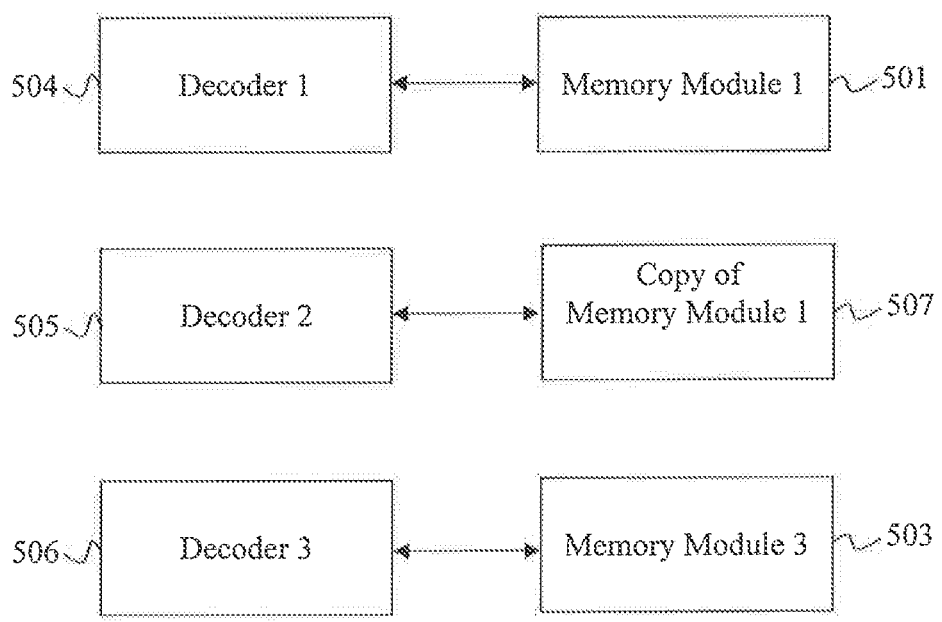

In pointer-based architecture, list decoding for a list of size L is maintained with L decoder units operating on L different memory modules. When a new list is determined (e.g., when a new information bit is decoded), a given survivor in the list may be duplicated, for example, in favor of another survivor that is to be deleted. In this case, two new decoder units operate, with a different immediate hypothesis, on a given survivor. This is exemplified, for example, in FIGS. 5A and 5B, which illustrate the copying of a survivor from a given memory module to another memory module. FIG. 5A illustrates memory modules (e.g. memory module 1 501, memory module 2 502, and memory module 3 503) and decoder units (e.g., decoder unit 1 504, decoder unit 2 505, and decoder unit 3 506) prior to such a copy operation, and FIG. 5B illustrates memory modules (e.g. memory module 1 501, memory module 3 503, and a copy of memory module 1 507) and decoder units (e.g., decoder unit 1 504, decoder unit 2 505, and decoder unit 3 506) after such a copy operation. As shown in FIGS. 5A and 5B, the survivor of decoder unit 2 is discarded and decoder unit 2 is set to operate on a branch of the survivor evaluated by decoder unit 1 prior to the copy operation. As a result, the entire contents of memory module 1 is copied to memory module 2.

In a pointer-based architecture, instead of copying the survivor memory itself, memory module pointers that point to the memory module that a decoder unit is to operate with are utilized. In some cases, for example, for partial sum memories and intermediate LLR memories, each decoder unit utilizes a set of memory module pointers for different memory address spaces.

As a result, instead of copying the contents of a memory module from a given survivor to its copy destination, only the pointers corresponding to that survivor are copied. This is illustrated, for example, in FIG. 6.

Figure 6:
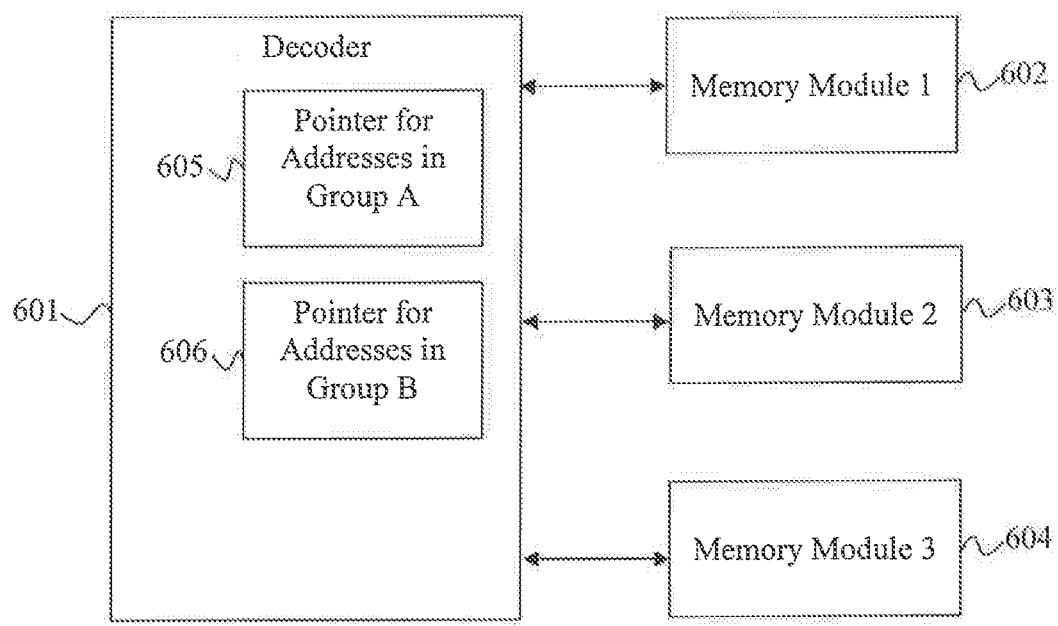
FIG. 6 illustrates a pointer-based architecture including a decoder unit and three memory modules, according to an exemplary embodiment of the present invention.

Referring to FIG. 6, a decoder unit 601 includes two pointers 605 and 606, and the decoder unit 601 communicates with three memory modules 602, 603 and 604. Each pointer may have a value of 1, 2 or 3 to point to one of memory module 1 602, memory module 2 603, or memory module 3 604. Data from two groups of address spaces (e.g., group A and group B) is to be read or written by the decoder unit 601. For example, if data having an address belonging to group A is to be read or written, the decoder unit 601 operates with the memory module set by the pointer for addresses in group A. When a survivor maintained by the decoder unit 601 is to be copied (e.g., to or from another branch), the memory modules, which may be large in size, are not copied; rather, only the pointers that are maintained by the decoder unit 601 are copied. In this case, the new decoder unit may read the same data as the decoder unit that generated this survivor (e.g., prior to the copy operation). Data write operations are performed with different pointer values, resulting in the two decoder units to generate two branches from the copy and operation.

According to exemplary embodiments, L decoder units $M\_1, \ldots M\_L$ each have a pointer function $P\_l(adr) \to [1:L]$, where $1 \leq l \leq L$. The function pointer maps an address to a memory module, and when a read or write operation by $M\_1$ is performed for address adr, the reading or writing is performed from memory module P_l(adr). The pointer functions may be constant, only a portion of the address adr may be of interest to the pointer functions, and/or different pointers may be used for read and write operations. According to exemplary embodiments, the pointer address is modified once survivor data is already read and used, resulting in the corresponding address space being used for write operations that are different for both branches of the survivor. The write operations may be set to constants. For example, P_l may be a permutation of [1:L] which is not dependent on the address adr, while the read pointer depends on the address adr. Once all read operations from a given address set is concluded, the pointer is set according to the constant write pointer permutations.

Figure 7:
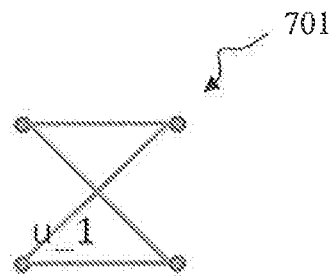
FIG. 7 illustrates a channel decoding graph indicating a partial sum arrangement for N=2, according to an exemplary embodiment of the present invention.
Figure 8:
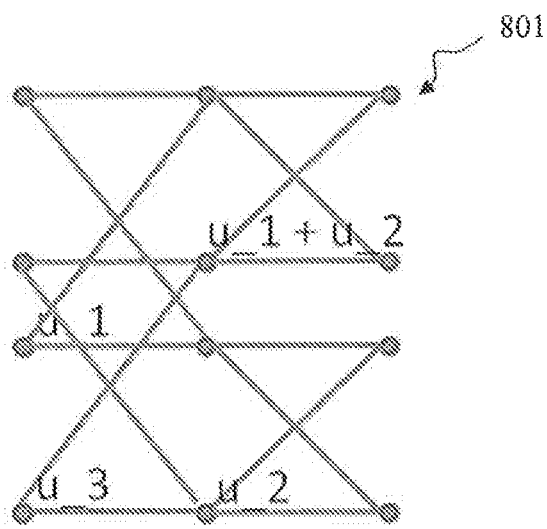
FIG. 8 illustrates a channel decoding graph indicating a partial sum arrangement for N=4, according to an exemplary embodiment of the present invention.
Figure 9:
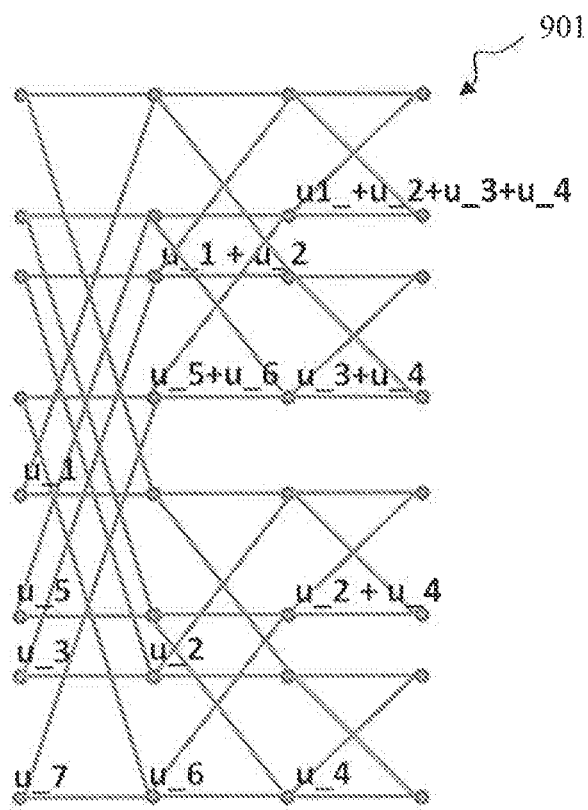
FIG. 9 illustrates a channel decoding graph indicating a partial sum arrangement for N=8, according to an exemplary embodiment of the present invention.

FIG. 7 illustrates a channel decoding graph 701 indicating a partial sum arrangement for N=2. FIG. 8 illustrates a channel decoding graph 801 indicating a partial sum arrangement for N=4. FIG. 9 illustrates a channel decoding graph 901 indicating a partial sum arrangement for N=8. In FIGS. 7 to 9, N represents the number of bits input to a noisy channel (e.g., a memory module).

Herein, the partial sum value architecture is described with respect to the address space formed by column and row addresses, which in the actual physical medium, may be transformed to a linear address space. Referring to FIGS. 7 to 9, channel decoding graphs are used to illustrate the memory arrangement. In the graphs, each lower left vertex in an X-shaped sub-graph may store a bit of a partial sum. This partial sum bit is used in the evaluation of the LLR for this vertex. For example, this partial sum bit controls a sign in the evaluation of the LLR of the corresponding vertex, indicating whether the LLR of the two right vertices of the corresponding X-shape sub-graph are to be summed or subtracted. In FIGS. 7 to 9, the partial sum is denoted next to the corresponding lower left vertex whose operation requires the denoted partial sum.

Referring to FIG. 7, the graph is composed of four nodes, including two leftmost nodes connected to two rightmost nodes. In FIG. 7, the only partial sum is u_11. As shown in FIG. 7, when N=2, the entire graph is an X-shaped graph. Referring to FIG. 8, the partial sums are u_1, u_2, u_3, and u_1+u_2. The partial sum u_1 is required to provide the LLR for the decision of u_2, the partial sums u_2 and u_1+u_2 are required for intermediate LLR evaluations, and the partial sum u_3 is required for the evaluation of the LLR in the decision of u_4. Referring to FIG. 9, the partial sums are u_1, u_2, u_3, u_4, u_5, u_6, u_1+u_2, u_2+u_4, u_3+u_4, u_5+u_6, and u_1+u_2+u_3+u_4.

According to exemplary embodiments, a survivor copy is carried only if pointers for the column address are retained. For a list of size L, L memory modules are maintained for partial sums, and each bit is addressed via a row address and a column address corresponding to the location in the decoding graphs illustrated in FIGS. 7 to 9. For example, for N=4 (see FIG. 8), the memory module from which the partial sums u_1 and u_3 are to be read from are copied once a survivor copy is to be made. For N=8 (see FIG. 9), the memory module from which u_1, u_5, u_3, and u_7 are to be read from is copied within a single pointer. Similarly, the memory module from which u_1+u_2, u_5+u_6, u_2, and u_6 are to be read from, and the memory module from which u_1+u_2+u_3+u_4, u_3+u_4, u_2+u_4, and u_4 are to be read from are respectively copied within a single pointer. As a result, each of the L decoder units M_1, . . . M_L maintains a list of log N pointers (to a space [1:L]), which indicates to each decoder unit from which of the L memory modules the required partial sum is to be read from. For example, let p_l^c, where 1≤l≤L, be the pointer for the l decoder unit M_1.

Utilizing pointer functions, the address to be read is a pair adr==(r,c) and the mapping depends only on the column address. When the l machine M_l is required to read the partial sum in row r and column c, the decoder unit reads from the memory module p_l^c. More specifically, the decoder unit reads the partial sum in location row r, column c. All partial sums of the decoder unit M_l are written to the l-th memory module, and once a column is written by a decoder unit, the pointer p_l^c of the l-th machine is set to l.

According to exemplary embodiments, read and write operations are not performed at arbitrary times. Rather, with reference to operating on the decoding graphs, vertices are operated on in variable length consecutive sequences of vertices from the same column. Further, within such sequences, vertices are processed from lower to upper rows in the decoding graph. This approach does not adversely affect the decoding results and the intermediate LLR values, which do not change regardless of the order within such consecutive sequences, and provides the benefit of allowing the partial sum data to be readily provided for future operations. This process ordering sequence is illustrated in FIG. 10.

Figure 10:
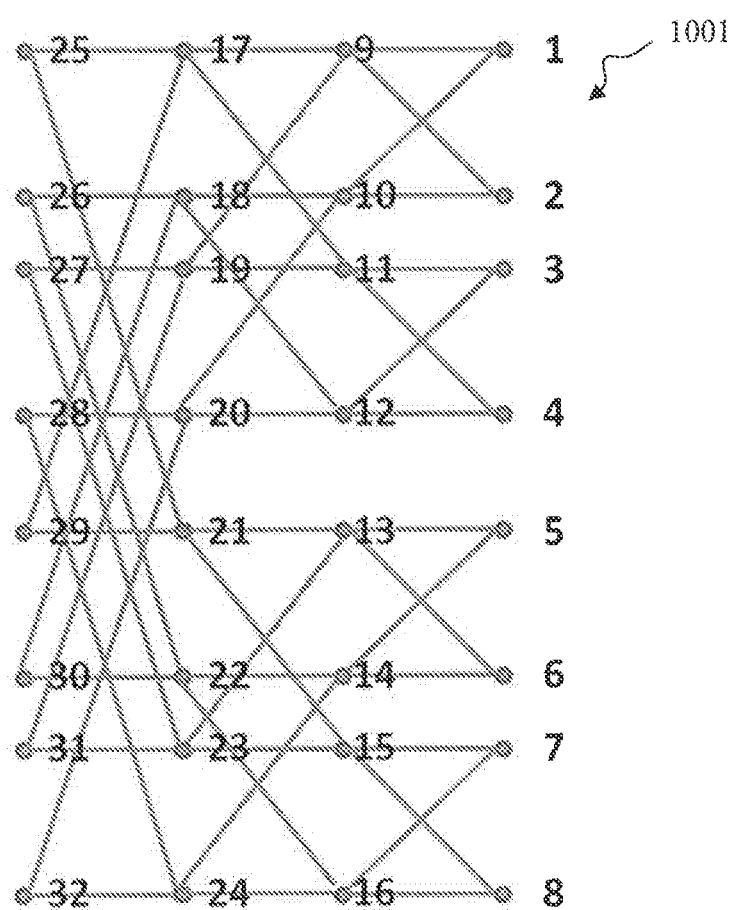
FIG. 10 illustrates a process ordering sequence of vertices in a decoding graph according, according to an exemplary embodiment of the present invention.

FIG. 10 illustrates a process ordering sequence of vertices in a decoding graph 1001 according to exemplary embodiments of the present invention.

Referring to FIG. 10, nodes 1-8 are channel LLR nodes. The remaining nodes are processed in the following order:
1. 15, 13, 11, 9
2. 21, 17
3. 25
4. 29
5. 23, 19
6. 27
7. 31
8. 16, 14, 12, 10
9. 22, 18
10. 26
11. 30
12. 24, 20
13. 28
14. 32

The 14 groups correspond to the grouping in accordance with a typical successive cancellation ordering process. However, according to exemplary embodiments of the present invention, rather than processing the nodes within each group arbitrarily, processing is performed from the lower rows to the upper rows in the 14 groups. For example, nodes are processed from the higher to the lower number, as shown in group 1 (e.g., from 15 to 9), group 2 (e.g., from 21 to 17), group 5 (e.g., 23 to 19), group 8 (e.g., 16 to 10), etc.

Referring still to FIG. 10, within each vertex, a single XOR operation of partial sums that is based on two reading operations (each from a different column) and a single write operation is performed. In some cases, a read or write operation may be redundant since the data is already available, or since a partial sum operation is not required or evaluated. The evaluation of all partial sum data when N=8 is described herein with reference to the decoding graphs shown in FIGS. 9 and 10. Table 1 illustrates the detailed partial sum evaluations, including all read and write operations, when N=8. The addresses in Table 1 correspond to the node numbering in FIG. 10.

TABLE 1

Partial Sum Evaluation Order for N = 8

| Processed node | Required partial sum in current processing | Evaluated partial sum | Read values | Write values |
|---|---|---|---|---|
| 15, 13, 11, 9, 21, 17 | | No partial sum evaluations | | |
| 25 | | u_1 (decoded based on LLR result of node 25). | | u_1 is written in address 29 |
| 29 | | u_2 (decoded based on LLR result of node 29). | | u_2 is written in address 23 |
| 23 | u_2 | | u_2 | |
| 19 | u_2 + u_1 | u_2 + u_1 | u_2, u_1 | u_2 + u_1 is written in address 19 |
| 27 | | u_3 (decoded based on LLR result of node 27). | | u_3 is written in address 31 |
| 31 | u_3 | u_4 (decoded based on LLR result of node 31). | u_3 | u_4 is written in address 16 |
| 16 | u_4 | | u_4 | |
| 14 | u_2 + u_4 | u_2 + u_4 | u_2, u_4 | |
| 12 | u_3 + u_4 | u_3 + u_4 | u_3, u_4 | u_3 + u_4 is written in address 12 |
| 10 | u_1 + u_2 + u_3 + u_4 | (u_1 + u_2) + (u_3 + u_4) | u_1 + u_2, u_3 + u_4 | |
| 22, 18 | | | | |
| 26 | | u_5 (decoded based on LLR result of node 26). | | u_5 is written in address 30 |
| 30 | u_5 | u_6 (decoded based on LLR result of node 26). | u_5 | u_6 is written in address 24 |
| 24 | u_6 | | u_6 | |
| 20 | u_5 + u_6 | u_5 + u_6 | u_5, u_6 | |
| 28 | | u_7 (decoded based on LLR result of node 28). | | u_7 is written in address 32 |
| 32 | u_7 | | u_7 | |

According to exemplary embodiments, due to the decoding schedule in which columns are processed and all intermediate data is determined before moving to the next column, once all partial sum information is read from a given column, the partial sum information is not utilized for additional reading. As a result, when evaluating LLRs (which control the sign that relate to partial sum information), a partial sum is utilized only once during the processing of the nodes of the considered column. For example, each partial sum is read once, is used, and is no longer utilized for another LLR evaluation. However, this partial sum is utilized for the evaluation of another partial sum. The decoding schedule according to exemplary embodiments of the present invention solves this problem by processing nodes from lower rows to upper rows where partial sums are read, evaluated and written to another column. The column to which the new partial sums is written to is already read in the past, and its information is no longer needed. Thus, once a column is written, all of the partial sums in this column are already read and processed, and thus, are not required to be pointers for these values.

Referring again to FIG. 8, when N=4, once the partial sum u_3 is written, the partial sum u_1 has already been used and is not to be read in subsequent operations (u_3 is the data to be read next). Thus, the pointer for this column is changed according to the memory module in which u_3 is written rather than to the memory module in which u_11 was written. Referring again to FIG. 9, when N=8, as well as to Table 1, the partial sums u_1+u_2 and u_2 are located in the same memory module. When the partial sums u_5+u_6 and u_6 are written, the partial sums u_1+u_2 and u_2 are no longer needed. Thus, the pointer of this column is set to the location at which u_5+u_6 and u_6 are written instead of the location at which u_1+u_2 and u_2 are located. As can be seen, according to exemplary embodiments, all partial sum values that were written in a given column were consecutively written between the same two copy operations, and thus, belong to the same survivor. All of these partial sums correspond to the same survivor, and are therefore maintained by a single pointer location (e.g., the column pointer). The partial sums that have already been read are not required when processing is performed from the lower rows to the upper rows. As a result, according to exemplary embodiments, the pointer of a column that has already been read is not retained.

Figure 11:
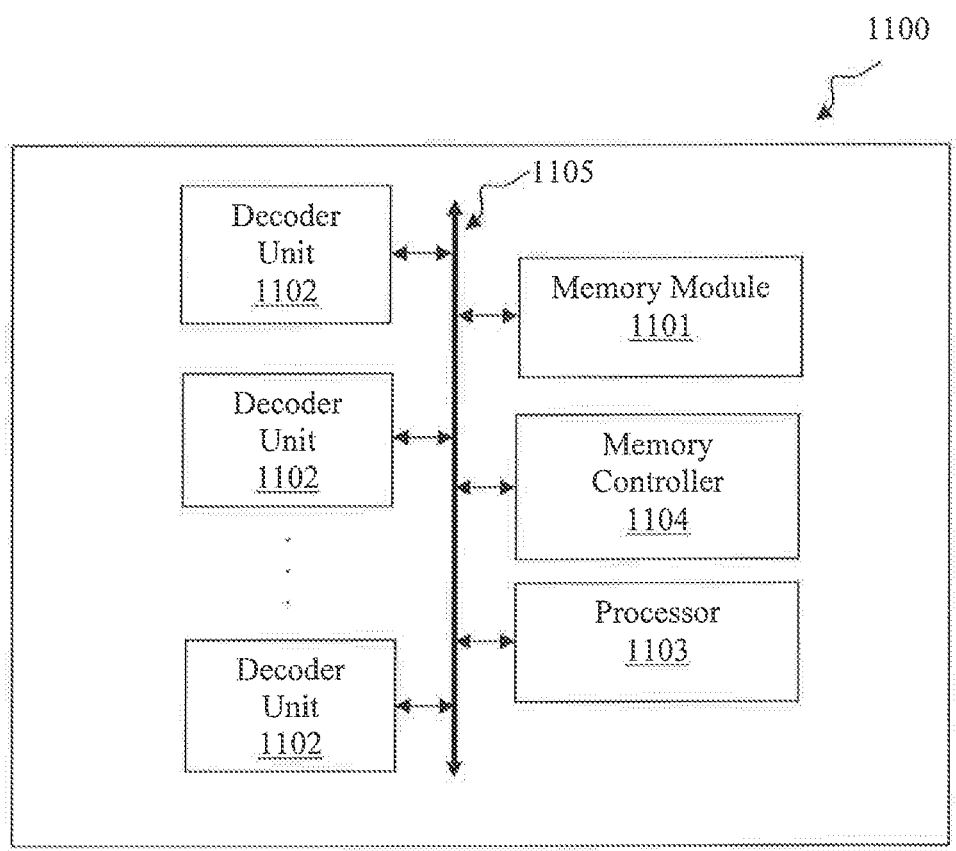
FIG. 11 illustrates a channel polarization code decoding system, according to an exemplary embodiment of the present invention.

FIG. 11 illustrates a channel polarization code decoding system, according to an exemplary embodiment of the present invention.

The channel polarization code decoding system 1100 shown in FIG. 11 may implement the method of storing survivor data generated while decoding channel polarization codes in a memory module according to exemplary embodiments of the present invention, as described above. In an exemplary embodiment, the channel polarization code decoding system 1100 includes a memory module 1101, a plurality of decoder units 1102, a processor 1103, and a memory controller 1104 connected to one another via a data bus 1105. Each of the decoder units 1102 may be a list successive cancellation decoder unit that decodes the input bits using a list successive cancellation decoding technique, as described above. The memory module 1101 may be a flash memory, as described above. The memory controller 1104 may be under control of the processor 1103, and may control the memory module 1101.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A method of storing survivor data generated while decoding channel polarization codes in a memory module, comprising:
setting a list size, by a processor, wherein the list size corresponds to a number of decoder units used to decode the channel polarization codes;
inputting, under control of the processor, a stream of input bits to the decoder units;
sequentially decoding the input bits, by the decoder units, wherein each input bit is decoded using all previous input bits decoded before the each input bit;
selecting, by the processor, a plurality of survivor bits from among the decoded input bits; and
storing, under control of the processor, the selected survivor bits in the memory module in a binary tree configuration, wherein a number of edges in each level of the binary tree configuration does not exceed the list size.

2. The method of claim 1, wherein the input bits are sequentially decoded using a list successive cancellation decoding technique.

3. The method of claim 2, wherein sequentially decoding the input bits using the list successive cancellation decoding technique comprises:
computing a plurality of intermediate values, wherein the intermediate values are computed by decoding the each input bit based on a plurality of guesses of the values of the previous input bits decoded before the each input bit, wherein each guess corresponds to a bit value being equal to 0 or being equal to 1.

4. The method of claim 3, further comprising:
selecting a plurality of most probable guesses from among the plurality of guesses using a log-likelihood ratio (LLR) technique;
retaining the selected most probable guesses in the memory module; and
discarding the guesses from among the plurality of guesses that are not selected as the most probable guesses.

5. The method of claim 3, wherein storing the selected survivor bits in the memory module in the binary tree configuration comprises:
comparing a first group of intermediate values from among the plurality of intermediate values with a second group of intermediate values from among the plurality of intermediate values,
wherein the first and second groups are separated into subgroups, each subgroup corresponding to intermediate values obtained during one of a plurality of stages of the sequential decoding process,
wherein the comparison is made on a stage-by-stage basis,
wherein each stage corresponds to one of the levels of the binary tree configuration; and
generating the edges in each of the levels of the binary tree configuration based on the comparison result.

6. The method of claim 5, wherein generating the edges in each of the levels of the binary tree configuration based on the comparison result comprises:
comparing intermediate values from a subgroup of the first group with corresponding intermediate values from a subgroup of the second group;
generating only a left edge at a vertex when the compared intermediate values include an intermediate value in the subgroup of the first group that is equal to 1 and an intermediate value in the subgroup of the second group that is equal to 0;
generating only a right edge at the vertex when the compared intermediate values include an intermediate value in the subgroup of the first group that is equal to 0 and an intermediate value in the subgroup of the second group that is equal to 1;
generating both the left edge and the right edge at the vertex when the compared intermediate values include an intermediate value in the subgroup of the first group that is equal to 1 and an intermediate value in the subgroup of the second group that is equal to 1; and
generating neither the left edge nor the right edge at the vertex when the compared intermediate values include an intermediate value in the subgroup of the first group that is equal to 0 and an intermediate value in the subgroup of the second group that is equal to 0,
wherein the vertex corresponds to the compared intermediate values.

7. The method of claim 6, wherein the left edges represent a value of 0 and the right edges represent a value of 1.

8. The method of claim 6, wherein the left edges represent a value of 1 and the right edges represent a value of 0.

9. The method of claim 5, wherein generating the edges in each of the levels of the binary tree configuration based on the comparison result comprises:
comparing intermediate values from a subgroup of the first group with corresponding intermediate values from a subgroup of the second group;
generating only a left edge at a vertex when the compared intermediate values include an intermediate value in the subgroup of the first group that is equal to 0 and an intermediate value in the subgroup of the second group that is equal to 1;
generating only a right edge at the vertex when the compared intermediate values include an intermediate value in the subgroup of the first group that is equal to 1 and an intermediate value in the subgroup of the second group that is equal to 0;
generating both the left edge and the right edge at the vertex when the compared intermediate values include an intermediate value in the subgroup of the first group that is equal to 1 and an intermediate value in the subgroup of the second group that is equal to 1; and
generating neither the left edge nor the right edge at the vertex when the compared intermediate values include an intermediate value in the subgroup of the first group that is equal to 0 and an intermediate value in the subgroup of the second group that is equal to 0,
wherein the vertex corresponds to the compared intermediate values.

10. The method of claim 9, wherein the left edges represent a value of 0 and the right edges represent a value of 1.

11. The method of claim 9, wherein the left edges represent a value of 1 and the right edges represent a value of 0.

12. The method of claim 5, wherein generating the edges in each of the levels of the binary tree configuration based on the comparison result comprises:
comparing intermediate values from a subgroup of the first group with corresponding intermediate values from a subgroup of the second group;
generating only a left edge at a vertex when the compared intermediate values include an intermediate value in the subgroup of the first group that is equal to 1 and an intermediate value in the subgroup of the second group that is equal to 0;

generating only a right edge at the vertex when the compared intermediate values include an intermediate value in the subgroup of the first group that is equal to 0 and an intermediate value in the subgroup of the second group that is equal to 1;

generating both the left edge and the right edge at the vertex when the compared intermediate values include an intermediate value in the subgroup of the first group that is equal to 0 and an intermediate value in the subgroup of the second group that is equal to 0; and generating neither the left edge nor the right edge at the vertex when the compared intermediate values include an intermediate value in the subgroup of the first group that is equal to 1 and an intermediate value in the subgroup of the second group that is equal to 1, wherein the vertex corresponds to the compared intermediate values.

13. The method of claim 5, wherein generating the edges in each of the levels of the binary tree configuration based on the comparison result comprises:

comparing intermediate values from a subgroup of the first group with corresponding intermediate values from a subgroup of the second group;

generating only a left edge at a vertex when the compared intermediate values include an intermediate value in the subgroup of the first group that is equal to 0 and an intermediate value in the subgroup of the second group that is equal to 1;

generating only a right edge at the vertex when the compared intermediate values include an intermediate value in the subgroup of the first group that is equal to 1 and an intermediate value in the subgroup of the second group that is equal to 0;

generating both the left edge and the right edge at the vertex when the compared intermediate values include an intermediate value in the subgroup of the first group that is equal to 0 and an intermediate value in the subgroup of the second group that is equal to 0; and generating neither the left edge nor the right edge at the vertex when the compared intermediate values include an intermediate value in the subgroup of the first group that is equal to 1 and an intermediate value in the subgroup of the second group that is equal to 1, wherein the vertex corresponds to the compared intermediate values.

14. The method of claim 1, wherein the memory module is a flash memory.

15. A channel polarization code decoding system, comprising:

a memory module;

a plurality of decoder units that receive and sequentially decode a stream of input bits, wherein the input bits represent channel polarization codes, and each input bit is decoded using all previous input bits decoded before the each input bit;

a processor that sets a list size and selects a plurality of survivor bits from among the decoded input bits, wherein the list size corresponds to a total number of the decoder units; and a memory controller that controls the memory module to store the selected survivor bits in the memory module in a binary tree configuration under control of the processor, wherein a number of edges in each level of the binary tree configuration does not exceed the list size.

16. The channel polarization code decoding system of claim 15, wherein each decoder unit is a list successive cancellation decoder unit that decodes the input bits using a list successive cancellation decoding technique.

17. The channel polarization code decoding system of claim 16, wherein the decoder units decode the input bits using the list successive cancellation decoding technique by computing a plurality of intermediate values, wherein the intermediate values are computed by decoding the each input bit based on a plurality of guesses of the values of the previous input bits decoded before the each input bit, wherein each guess corresponds to a bit value being equal to 0 or being equal to 1.

18. The channel polarization code decoding system of claim 17, wherein the memory controller controlling the memory module to store the selected survivor bits in the memory module in the binary tree configuration under control of the processor comprises:

comparing a first group of intermediate values from among the plurality of intermediate values with a second group of intermediate values from among the plurality of intermediate values, wherein the first and second groups are separated into subgroups, each subgroup corresponding to intermediate values obtained during one of a plurality of stages of the sequential decoding process, wherein the comparison is made on a stage-by-stage basis, wherein each stage corresponds to one of the levels of the binary tree configuration; and generating the edges in each of the levels of the binary tree configuration based on the comparison result.

19. The channel polarization code decoding system of claim 18, wherein generating the edges in each of the levels of the binary tree configuration based on the comparison result comprises:

comparing intermediate values from a subgroup of the first group with corresponding intermediate values from a subgroup of the second group;

generating only a left edge at a vertex when the compared intermediate values include an intermediate value in the subgroup of the first group that is equal to 1 and an intermediate value in the subgroup of the second group that is equal to 0;

generating only a right edge at the vertex when the compared intermediate values include an intermediate value in the subgroup of the first group that is equal to 0 and an intermediate value in the subgroup of the second group that is equal to 1;

generating both the left edge and the right edge at the vertex when the compared intermediate values include an intermediate value in the subgroup of the first group that is equal to 1 and an intermediate value in the subgroup of the second group that is equal to 1; and generating neither the left edge nor the right edge at the vertex when the compared intermediate values include an intermediate value in the subgroup of the first group that is equal to 0 and an intermediate value in the subgroup of the second group that is equal to 0, wherein the vertex corresponds to the compared intermediate values.

20. The channel polarization code decoding system of claim 15, wherein the memory module is a flash memory.

* * * * *